(12) United States Patent
Lee

(10) Patent No.: US 11,963,293 B2
(45) Date of Patent: Apr. 16, 2024

(54) CIRCUIT BOARD STRUCTURE WITH WAVEGUIDE AND METHOD FOR MANUFACTURING THE SAME

(71) Applicant: BOARDTEK ELECTRONICS CORPORATION, Taoyuan (TW)

(72) Inventor: Chien-Cheng Lee, New Taipei (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 242 days.

(21) Appl. No.: 17/460,586

(22) Filed: Aug. 30, 2021

(65) Prior Publication Data

US 2023/0029270 A1 Jan. 26, 2023

(30) Foreign Application Priority Data

Jul. 23, 2021 (TW) ................................. 110127247

(51) Int. Cl.
*H05K 1/02* (2006.01)
*G02B 6/13* (2006.01)
(Continued)

(52) U.S. Cl.
CPC ............. *H05K 1/0274* (2013.01); *G02B 6/13* (2013.01); *H01P 3/121* (2013.01); *H05K 1/0298* (2013.01);
(Continued)

(58) Field of Classification Search
CPC .. H05K 1/0274; H05K 1/0298; H05K 3/4644; H05K 3/465; H05K 3/18; H05K 2201/10121; H05K 2201/09985; H05K 2201/037; H05K 2201/0723; H05K 2201/0919; H05K 1/0236; H05K 1/024;
(Continued)

(56) References Cited

U.S. PATENT DOCUMENTS 9,888,568 B2 * 2/2018 Parker .................. H05K 1/0298
11,264,688 B2 * 3/2022 Coquet ................. H01P 11/002
(Continued)

FOREIGN PATENT DOCUMENTS

CN 111149342 A * 5/2020 ............. H01Q 1/243
JP 2008193663 A * 8/2008 ......... H01Q 21/0075
(Continued)

*Primary Examiner* — Michelle R Connelly
*Assistant Examiner* — Mary A El-Shammaa
(74) *Attorney, Agent, or Firm* — ScienBiziP, P.C.

(57) ABSTRACT

A method for manufacturing a circuit board structure with a waveguide is provided. The method includes: providing a first substrate unit, a second substrate unit, a third substrate unit, and two adhesive layers, the first substrate unit including a first dielectric layer and a first conductive layer, the first conductive layer including a first shielding area and two first artificial magnetic conductor areas disposed on two sides of the first shielding area; the second substrate unit including a second dielectric layer and a second conductive layer, the second conductive layer including a second shielding area; the third substrate unit defining a first slot, and the adhesive layer defining a second slot; stacking the first substrate unit, one of the adhesive layers, the third substrate unit, another one of the adhesive layers, and the second substrate unit in that order; pressing the intermediate body.

19 Claims, 10 Drawing Sheets

(51) Int. Cl.
*H01P 3/12* (2006.01)
*H05K 3/46* (2006.01)

(52) U.S. Cl.
CPC . *H05K 3/4644* (2013.01); *H05K 2201/10121* (2013.01)

(58) Field of Classification Search
CPC ......... G02B 6/13; H01P 3/232; H01P 1/2088; H01P 1/207; H01P 1/2005; H01P 11/02; H01P 3/121; H01P 3/12
See application file for complete search history.

(56) References Cited

U.S. PATENT DOCUMENTS

| | | | |
|---|---|---|---|
| 2008/0150821 A1* | 6/2008 | Koch | H01Q 21/065 343/776 |
| 2015/0084208 A1* | 3/2015 | Iida | H01L 23/49827 257/774 |
| 2019/0098750 A1* | 3/2019 | Woo | H01Q 9/045 |
| 2020/0128702 A1* | 4/2020 | Cheng | H05K 3/4697 |
| 2020/0185802 A1* | 6/2020 | Vilenskiy | H01Q 1/38 |
| 2021/0222472 A1* | 7/2021 | Rowland | E05D 11/0081 |
| 2022/0131571 A1* | 4/2022 | Lukyanov | H01Q 9/16 |
| 2023/0011064 A1* | 1/2023 | Lee | H01P 11/002 |
| 2023/0027319 A1* | 1/2023 | Lee | H01P 3/121 |

FOREIGN PATENT DOCUMENTS

| | | | | |
|---|---|---|---|---|
| TW | 200739153 A | | 10/2007 | |
| TW | 202017441 A | | 5/2020 | |
| WO | WO-2015172948 A2 | * | 11/2015 | ............ H01P 1/2005 |
| WO | WO-2017050817 A1 | * | 3/2017 | ............ H01P 1/2005 |
| WO | WO-2018209422 A1 | * | 11/2018 | ............. H01P 3/006 |
| WO | WO-2021251866 A1 | * | 12/2021 | ................ H01P 1/20 |

\* cited by examiner

CIRCUIT BOARD STRUCTURE WITH WAVEGUIDE AND METHOD FOR MANUFACTURING THE SAME

FIELD

The subject matter herein generally relates to waveguides, and more particularly, to a circuit board structure with a waveguide and a method for manufacturing the circuit board structure.

BACKGROUND

Substrate Integrated Waveguide (SIW) is a new type of transmission line structure that can be integrated into a dielectric substrate. The SIW can be obtained by forming metallic layers on both sides of the dielectric substrate and drilling two arrays of metallic conductive holes in the dielectric substrate. The two arrays of metallic conductive holes can be equivalent to two metallic walls, and the transmission characteristics therebetween can be characterized as a rectangular waveguide.

However, the number of the metallic conductive holes may be very large, and the metallic conductive holes should have a high position accuracy, which lead to a high cost. Moreover, transmission loss may generate when microwaves is transmitted within the SIW. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
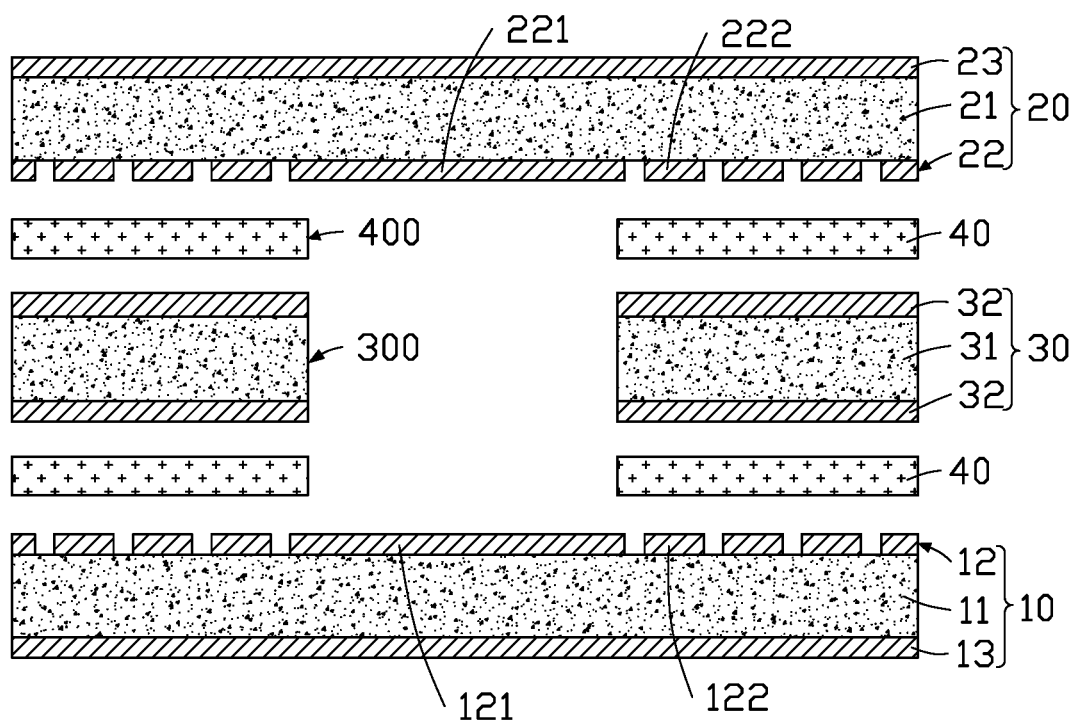
FIGS. 1 to 3 are diagrammatic views of an embodiment of a method for manufacturing a circuit board structure according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 4:
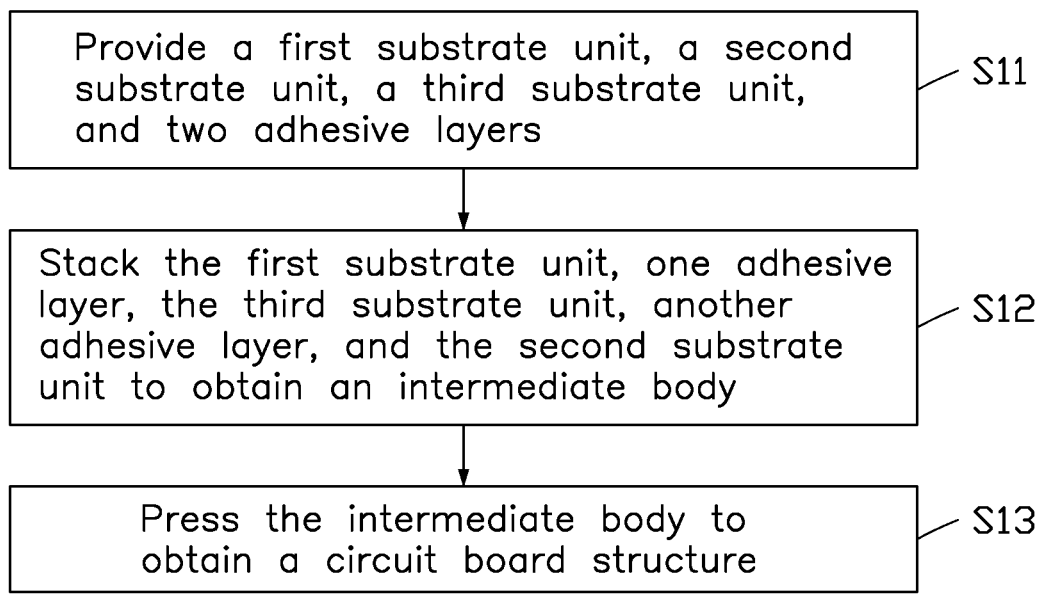
FIG. 4 is a flowchart of an embodiment of a method for manufacturing a circuit board structure according to the present disclosure.

Referring to FIG. 4, a method for manufacturing a circuit board structure 1 is presented in accordance with an embodiment. The circuit board structure 1 can be used in a radar system (such as an automotive millimeter wave radar). The method is provided by way of example, as there are a variety of ways to carry out the method. The method can begin at S11.

Step S11, referring to FIG. 1, a first substrate unit 10, a second substrate unit 20, a third substrate unit 30, and two adhesive layers 40 are provided.

The first substrate unit 10 includes a first dielectric layer 11 and a first conductive layer 12 disposed on the first dielectric layer 11. The first conductive layer 12 includes a first shielding area 121 and two first artificial magnetic conductor areas 122 disposed on two sides of the first shielding area 121.

The second substrate unit 20 includes a second dielectric layer 21 and a second conductive layer 22 disposed on the second dielectric layer 21. The second conductive layer 22 includes a second shielding area 221 and two second artificial magnetic conductor areas 222 disposed on two sides of the second shielding area 221. Each of the first artificial magnetic conductor area 122 and the second artificial magnetic conductor areas 222 include artificial magnetic conductors (Artificial Magnetic Conductors, AMCs). The artificial magnetic conductors can be manufactured by a method that is the same as that of circuit pattern. For example, the artificial magnetic conductors can be manufactured by etching a conductive layer through an exposure and development process. The artificial magnetic conductors can suppress or prevent electromagnetic waves within a specific frequency band (that is, a cut-off frequency band) from propagating along the surface of the artificial magnetic conductors. In some embodiments, along an extension direction of the first substrate unit 10 or the second substrate unit 20, each of the first artificial magnetic conductor areas 122 and the second artificial magnetic conductor areas 222 may include multiple rows of artificial magnetic conductors (such as 2 to 7 rows, and FIG. 1 shows that each of the first artificial magnetic conductor areas 122 and the second artificial magnetic conductor areas 222 includes three rows of artificial magnetic conductors). Each row of artificial magnetic conductors contains multiple artificial magnetic conductors repetitively arranged along a single direction, and the cross-sectional shape of each artificial magnetic conductor can be round, square, or other shapes.

The third substrate unit 30 includes a third dielectric layer 31 and two third conductive layers 32 disposed on two opposite surfaces of the third dielectric layer 31. The third substrate unit 30 defines a first slot 300 penetrating the third dielectric layer 31 and the third conductive layers 32. The first slot 300 can be formed by laser drilling or mechanical drilling.

Each of the adhesive layers 40 defines a second slot 400 penetrating the adhesive layer 40. The width of the second slot 400 may be the same as the width of the first slot 300. The second slot 400 can also be formed by laser drilling or mechanical drilling.

In some embodiments, the first substrate unit 10 may further include a first circuit layer 13, and the first dielectric layer 11 is disposed between the first conductive layer 12 and the first circuit layer 13. The second substrate unit 20 may further include a second circuit layer 23, and the second dielectric layer 21 is disposed between the second conductive layer 22 and the second circuit layer 23. Each of the third conductive layer 32 may be a circuit layer.

In some embodiments, each of the first dielectric layer 11, the second dielectric layer 21, and the third dielectric layer 31 is made of an insulating resin. The insulating resin may be selected from a group consisting of liquid crystal polymer (LCP), polytetrafluoroethylene (PTFE), polyetheretherketone (PEEK), polyphenylene oxide (PPO), polyimide (PI), and any combination thereof. The first dielectric layer 11, the second dielectric layer 21, and the third dielectric layer 31 may be made of a same insulating resin or different insulating resins.

In some embodiment, each of the adhesive layers 40 is made of an insulating resin. The insulating resin may be selected from a group consisting of liquid crystal polymer, polytetrafluoroethylene, polyether ether ketone, polyphenylene oxide, polyimide, and any combination thereof. The adhesive layers 40 may be made of a same insulating resin or different insulating resins.

Figure 2:
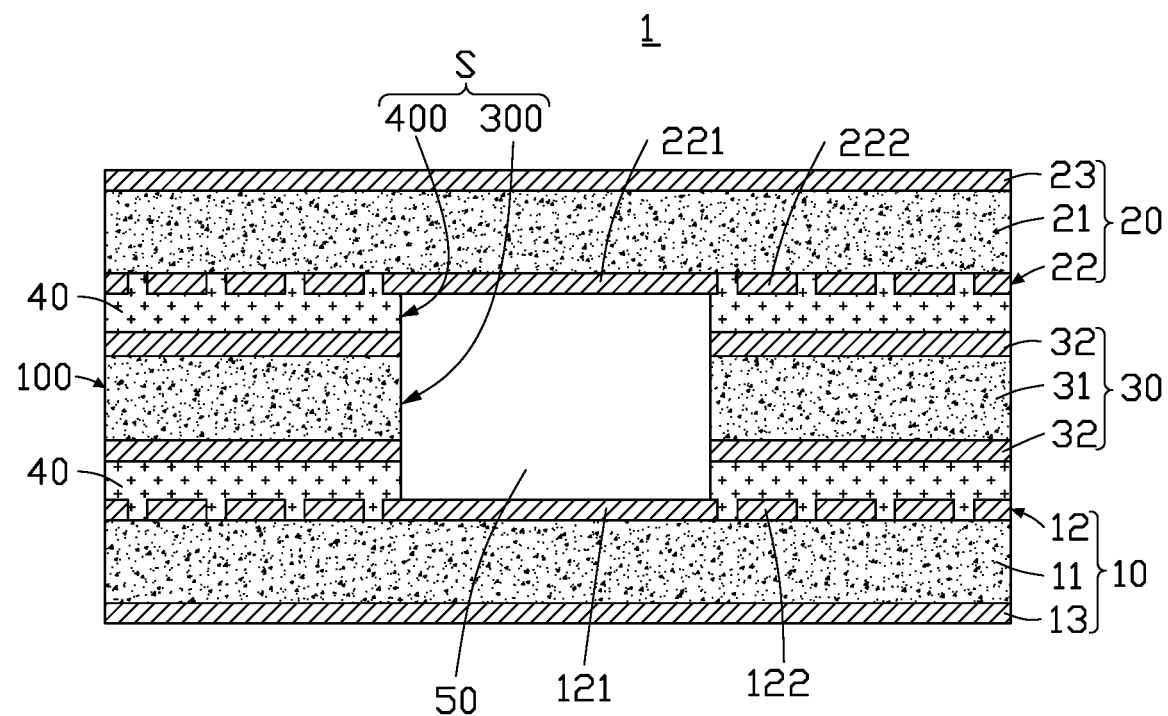

Step S12, referring to FIG. 2, the first substrate unit 10, one of the adhesive layers 40, the third substrate unit 30, another one of the adhesive layers 40, and the second substrate unit 20 are stacked in sequence, so that the first slot 300 and the second slot 400 are communicated with each other to form a cavity S, and the first shielding area 121 and the second shielding area 221 are respectively disposed on opposite sides of the cavity S. Thus, an intermediate body is obtained.

Step S13, the intermediate body is pressed to obtain the circuit board structure 1.

The adhesive layers 40 may be in a semi-cured state, which may flow during the pressing and then infill gaps between each of the first artificial magnetic conductor areas 122 and gaps between each of the second artificial magnetic conductor areas 222. The adhesive layers 40 are used to bond the first substrate unit 10, the third substrate unit 30, and the second substrate unit 20 together. The flow rate of the adhesive layers 40 can be controlled to prevent the adhesive layer 40 from entering the cavity S.

Figure 3:
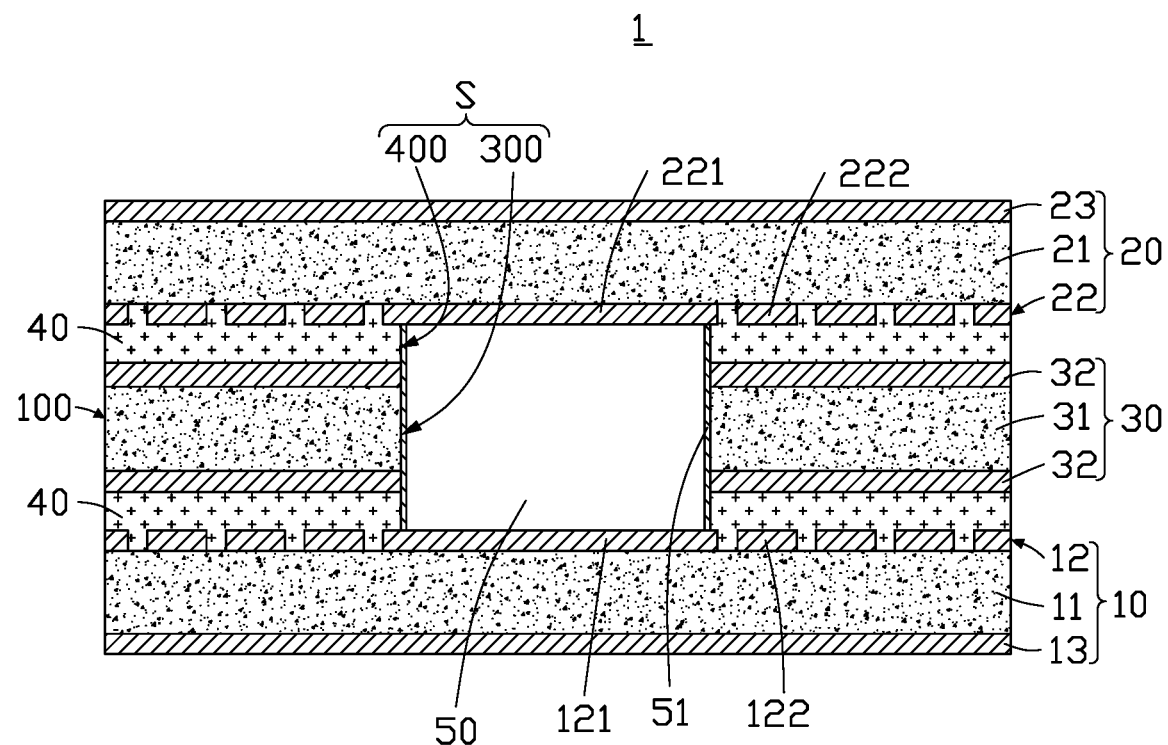

The cavity S having the first shielding area 121 and the second shielding area 221 forms a waveguide 50, so that the electromagnetic waves (signal waves) can propagate in the waveguide 50. Moreover, since the artificial magnetic conductors can suppress or prevent the electromagnetic waves within a specific frequency band from propagating along the surface of the artificial magnetic conductors, the electromagnetic waves propagated in the waveguide 50 will not leak out through the sidewalls of the cavity S. Thus, the transmission loss of the electromagnetic waves is reduced. In another embodiment, referring to FIG. 3, an electroplated layer 51 can also be plated on the sidewalls of the cavity S, to further prevent the electromagnetic waves propagated in the waveguide 50 from leaking out through the sidewalls of the cavity S. The electroplated layer 51 can include electroplated copper.

Figure 7:
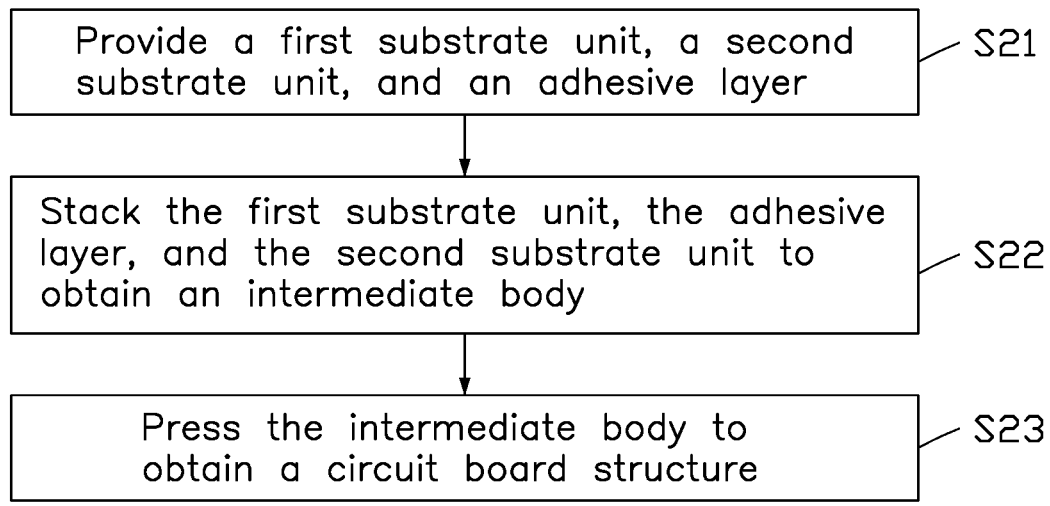
FIG. 7 is a flowchart of an embodiment of a method for manufacturing a circuit board structure according to the present disclosure.

Referring to FIGS. 7, a method for manufacturing a circuit board structure 2 is presented in accordance with another embodiment. The method is provided by way of example, as there are a variety of ways to carry out the method. The method can begin at S21.

Figure 5:
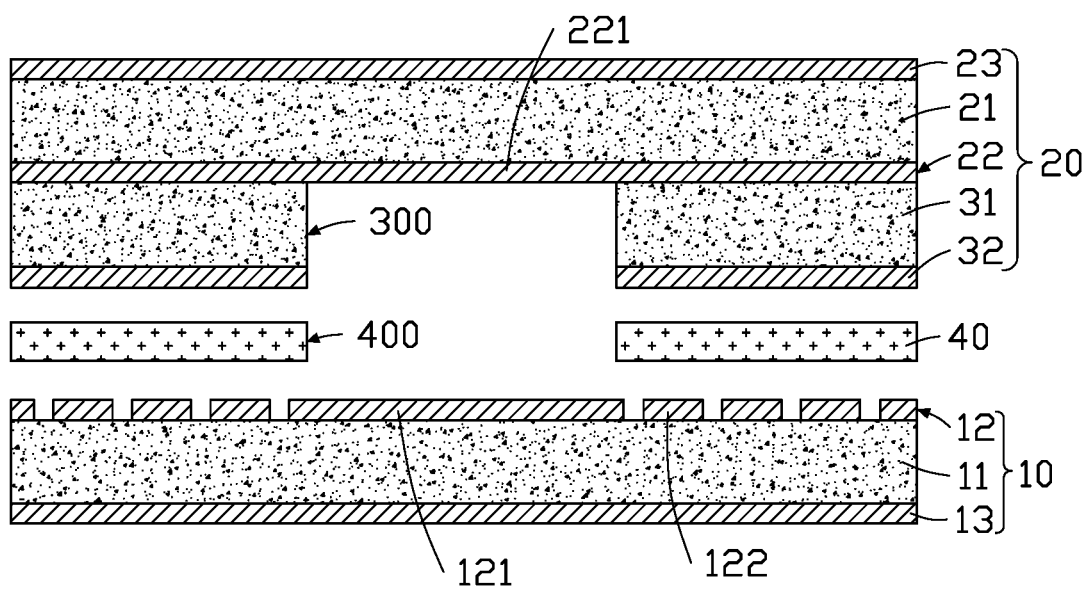
FIGS. 5 to 6 are diagrammatic views of another embodiment of a method for manufacturing a circuit board structure according to the present disclosure.

Step S21, referring to FIG. 5, a first substrate unit 10, a second substrate unit 20, and an adhesive layer 40 are provided.

The first substrate unit 10 includes a first dielectric layer 11 and a first conductive layer 12 disposed on the first dielectric layer 11. The first conductive layer 12 includes a first shielding area 121 and two first artificial magnetic conductor areas 122 disposed on two sides of the first shielding area 121. Each of the first artificial magnetic conductor areas 122 includes artificial magnetic conductors.

The second substrate unit 20 includes a second dielectric layer 21, a second conductive layer 22, a third dielectric layer 31, and a third conductive layer 32 stacked in that order. The second conductive layer 22 includes a second shielding area 221. The second substrate unit 20 defines a first slot 300 penetrating the third dielectric layer 31 and the third conductive layer 32. The second shielding area 221 is disposed on a bottom surface of the first slot 300.

The adhesive layer 40 defines a second slot 400 penetrating the adhesive layer 40. The width of the second slot 400 may be the same as the width of the first slot 300.

In some embodiments, the first substrate unit 10 may further include a first circuit layer 13, and the first dielectric layer 11 is disposed between the first conductive layer 12 and the first circuit layer 13. The second substrate unit 20 may further include a second circuit layer 23, and the second dielectric layer 21 is disposed between the second conductive layer 22 and the second circuit layer 23. The third conductive layer 32 may be a circuit layer.

Figure 6:
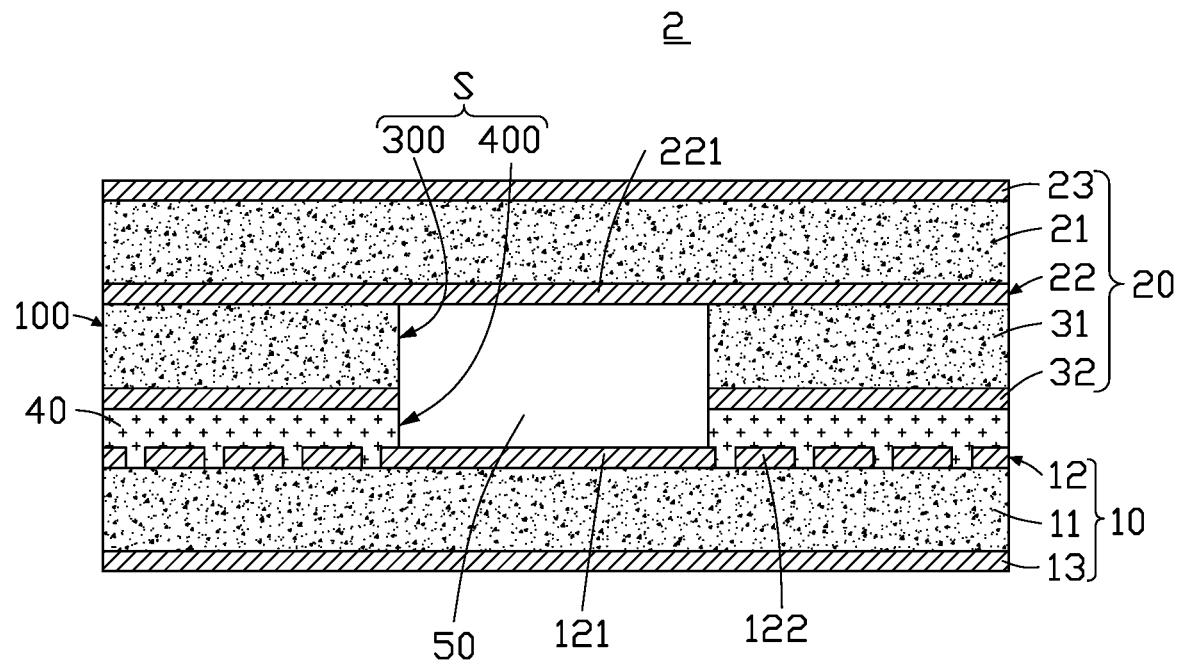

Step S22, referring to FIG. 6, the first substrate unit 10, the adhesive layer 40, and the second substrate unit 20 are stacked in that order, so that the first slot 300 and the second slot 400 are communicated with each other to form a cavity S, and the first shielding area 121 and the second shielding area 221 are respectively disposed on two opposite sides of the cavity S. Thus, an intermediate body is obtained.

Step S23, the intermediate body is pressed to obtain the circuit board structure 2.

The adhesive layer 40 may be in a semi-cured state, which may flow during the pressing and infills gaps of each of the first artificial magnetic conductor areas 122. The adhesive layer 40 is used to bond the first substrate unit 10 and the second substrate unit 20 together. The flow rate of the adhesive layer 40 can be controlled to prevent the adhesive layer 40 from entering the cavity S.

The cavity S having the first shielding area 121 and the second shielding area 221 forms a waveguide 50, so that the electromagnetic waves (signal waves) can propagate in the waveguide 50. Moreover, since the artificial magnetic conductors can suppress or prevent the electromagnetic waves within a specific frequency band from propagating along the surface of the artificial magnetic conductors, the electromagnetic waves propagated in the waveguide 50 will not leak out through the sidewalls of the cavity S. Thus, the transmission loss of the electromagnetic waves is reduced. In another embodiment, an electroplated layer (not shown) can also be plated on the sidewalls of the cavity S, to further prevent the electromagnetic waves propagated in the waveguide 50 from leaking out through the sidewalls of the cavity S.

Figure 10:
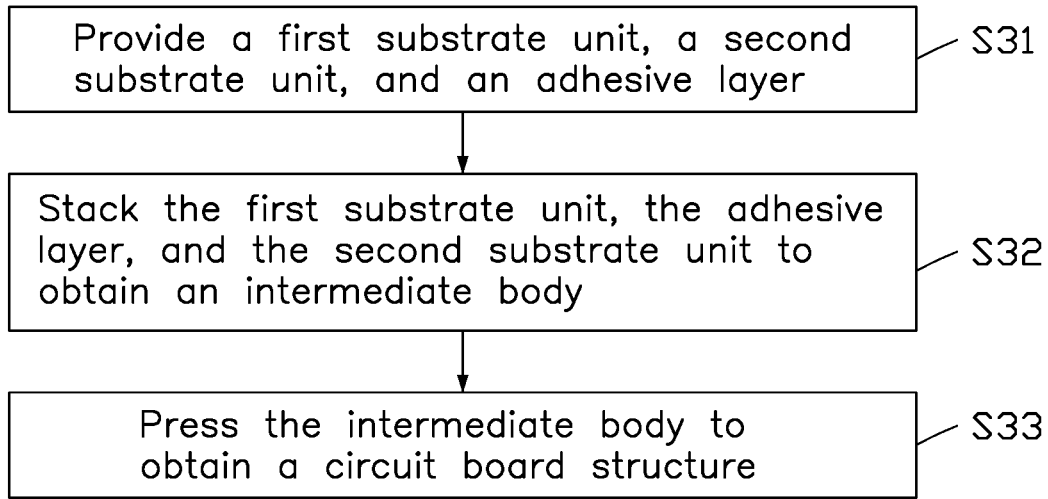
FIG. 10 is a flowchart of an embodiment of a method for manufacturing a circuit board structure according to the present disclosure.

Referring to FIG. 10, a method for manufacturing a circuit board structure 3 is presented in accordance with yet another embodiment. The method is provided by way of example, as there are a variety of ways to carry out the method. The method can begin at S31.

Figure 8:
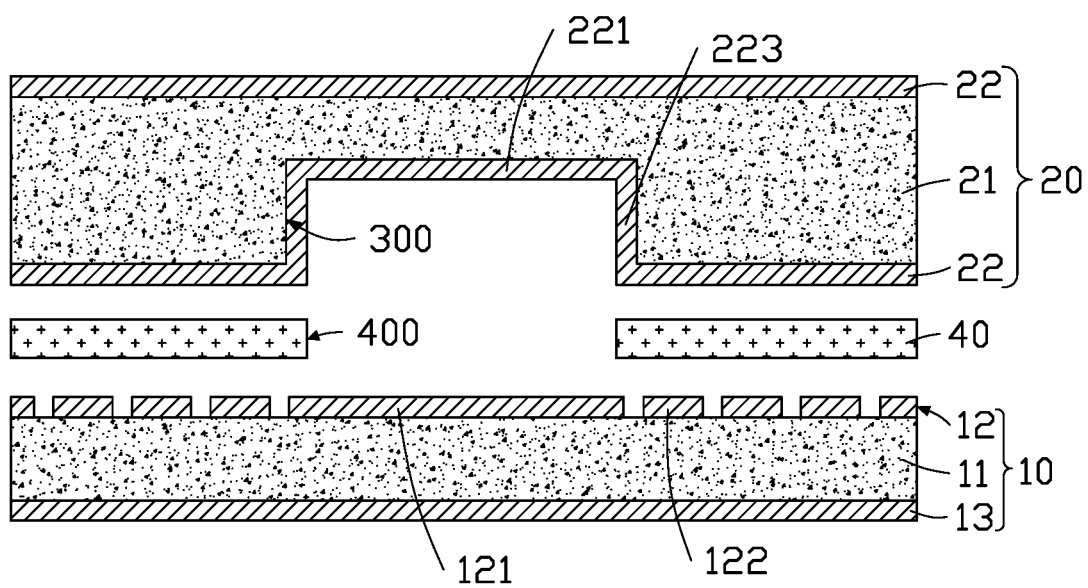
FIGS. 8 to 9 are diagrammatic views of yet another embodiment of a method for manufacturing a circuit board structure according to the present disclosure.

Step S31, referring to FIG. 8, a first substrate unit 10, a second substrate unit 20, and an adhesive layer 40 are provided.

The first substrate unit 10 includes a first dielectric layer 11 and a first conductive layer 12 disposed on the first dielectric layer 11. The first conductive layer 12 includes a first shielding area 121 and two first artificial magnetic conductor areas 122 disposed on two sides of the first shielding area 121. Each of the first artificial magnetic conductor areas 122 includes artificial magnetic conductors.

The second substrate unit 20 includes a second dielectric layer 21 and a second conductive layer 22 disposed on the second dielectric layer 21. The second dielectric layer 21 defines a first slot 300, which is formed by a surface of the second dielectric layer 21 recessed inwardly. The first slot 300 does not penetrate the other opposite surface of the second dielectric layer 21. The second conductive layer 22 is disposed on the surfaces of the second dielectric layer 21, and also on the sidewalls and the bottom surface of the first slot 300. The second conductive layer 22 disposed on the bottom surface of the first slot 300 forms a second shielding area 221, and the second conductive layer 22 disposed on the sidewalls of the first slot 300 forms a third shielding area 223.

In some embodiments, the second dielectric layer 21 may be prepared by injection molding. The second dielectric layer 21 may be made of a thermoplastic polymer material, which may be resistant to high temperatures and have a low thermal expansion coefficient. For example, the second dielectric layer 21 may be made of polyolefin.

In some embodiments, the second conductive layer 22 made be made of at least one metal such as copper, gold, and silver. The second conductive layer 22 can be formed by electroplating, chemical vapor deposition, or printing.

The adhesive layer 40 defines a second slot 400 penetrating the adhesive layer 40. The width of the second slot 400 may be the same as the width of the first slot 300.

In some embodiments, the first substrate unit 10 may further include a first circuit layer 13, and the first dielectric layer 11 is disposed between the first conductive layer 12 and the first circuit layer 13.

Figure 9:
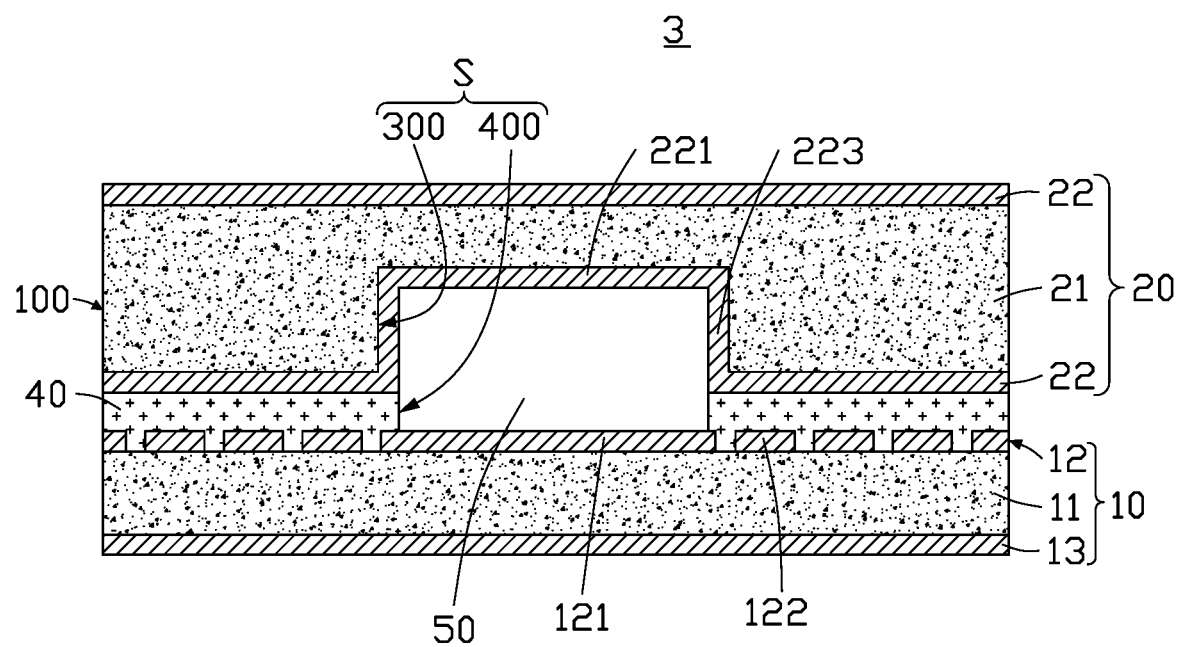

Step S32, referring to FIG. 9, the first substrate unit 10, the adhesive layer 40, and the second substrate unit 20 are stacked in that order, so that the first slot 300 and the second slot 400 are communicated with each other to form a cavity S, and the first shielding area 121 and the second shielding area 221 are respectively disposed on both sides of the cavity S. Thus, an intermediate body is obtained.

Step S33, the intermediate body is pressed to obtain the circuit board structure 3.

The adhesive layer 40 may be in a semi-cured state, which may flow during the pressing and infill gaps of each of the first artificial magnetic conductor areas 122. The adhesive layer 40 is used to bond the first substrate unit 10 and the second substrate unit 20 together. The flow rate of the adhesive layer 40 can be controlled to prevent the adhesive layer 40 from entering the cavity S.

The cavity S having the first shielding area 121, the second shielding area 221 and the third shielding area 223 forms a waveguide 50, so that electromagnetic waves can propagate in the waveguide 50. The third shielding area 223 can prevent the electromagnetic waves propagating in the waveguide 50 from leaking out through the sidewalls of the cavity S. Furthermore, since the artificial magnetic conductors can suppress or prevent the electromagnetic waves within a specific frequency band from propagating along the surface of the artificial magnetic conductors, the electromagnetic waves propagated in the waveguide 50 can further be prevented from leaking out through the sidewalls of the cavity S. The transmission loss of the electromagnetic waves is further reduced.

In other embodiments, the third shielding area 223 may be omitted, that is, the second conductive layer 22 may not be disposed on the sidewalls of the first slot 300. Due to the artificial magnetic conductors, the electromagnetic wave propagated in the waveguide 50 can also be prevented from leaking out through the sidewalls of the cavity S.

In the present disclosure, the artificial magnetic conductors can prevent signal leakage without the need to define the metallic through holes, thereby reducing the requirements for process accuracy and process costs, and at the same time improving the product yield. Since the medium in the waveguide 50 is air, that is, the electromagnetic waves propagate in the air, so the transmission loss is further reduced.

Referring to FIG. 2, an embodiment of a circuit board structure 1 manufactured by the above method is provided, which includes a circuit board 100 and a waveguide 50 disposed in the circuit board 100. The circuit board 100 includes a first substrate unit 10, an adhesive layer 40, a third substrate unit 30, another adhesive layer 40, and a second substrate unit 20 stacked in that order.

The first substrate unit 10 includes a first dielectric layer 11 and a first conductive layer 12 disposed on the first dielectric layer 11. The first conductive layer 12 includes a first shielding area 121 and two first artificial magnetic conductor areas 122 disposed on both sides of the first shielding area 121. The second substrate unit 20 includes a second dielectric layer 21 and a second conductive layer 22 disposed on the second dielectric layer 21. The second conductive layer 22 includes a second shielding area 221. The third substrate unit 30 defines a first slot 300. The adhesive layer 40 defines a second slot 400.

The first slot 300 and the second slot 400 are communicated with each other to form a cavity S, and the first shielding area 121 and the second shielding area 221 are disposed on opposite sides of the cavity S. The cavity S having the first shielding area 121 and the second shielding area 221 forms the waveguide 50.

Referring to FIG. 6, another embodiment of a circuit board structure 2 is provided, which includes a circuit board 100 and a waveguide 50 disposed in the circuit board 100. The circuit board 100 includes a first substrate unit 10, an adhesive layer 40, and a second substrate unit 20 stacked in that order.

The first substrate unit 10 includes a first dielectric layer 11 and a first conductive layer 12 disposed on the first dielectric layer 11. The first conductive layer 12 includes a first shielding area 121 and two first artificial magnetic conductor areas 122 disposed on both sides of the first shielding area 121. The second substrate unit 20 includes a second dielectric layer 21, a second conductive layer 22, a third dielectric layer 31, and a third conductive layer 32 stacked in that order. The second conductive layer 22 includes a second shielding area 221. The second substrate unit 20 defines a first slot 300 penetrating the third dielectric layer 31 and the third conductive layer 32. The second shielding area 221 is located at a bottom surface of the first slot 300. The adhesive layer 40 defines a second slot 400.

The first slot 300 and the second slot 400 are communicated with each other to form a cavity S. The first shielding area 121 and the second shielding area 221 are disposed on opposite sides of the cavity S. The cavity S having the first shielding area 121 and the second shielding area 221 forms the waveguide 50.

Referring to FIG. 9, yet another embodiment of a circuit board structure 3 is provided. Different from the circuit board structure 2, the first slot 300 of the second substrate unit 20 is formed by a surface of the second dielectric layer 21 recessed inwardly. The second conductive layer 22 is disposed at least on the bottom surface and sidewalls of the first slot 300. The second conductive layer 22 disposed on the bottom surface of the first slot 300 forms the second shielding area 221, and the second conductive layer 22 disposed on the sidewalls of the first slot 300 forms a third shielding area 223. The cavity S having the first shielding area 121, the second shielding area 221, and the third shielding area 223 forms the waveguide 50.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board structure with a waveguide, the method comprising:
providing a first substrate unit, a second substrate unit, a third substrate unit, and two adhesive layers, the first substrate unit comprising a first dielectric layer and a first conductive layer disposed on the first dielectric layer, the first conductive layer comprising a first shielding area and two first artificial magnetic conductor areas disposed on two sides of the first shielding area; the second substrate unit comprising a second dielectric layer and a second conductive layer disposed on the second dielectric layer, the second conductive layer comprising a second shielding area; the third substrate unit defining a first slot, and the adhesive layer defining a second slot;
stacking the first substrate unit, one of the adhesive layers, the third substrate unit, another one of the adhesive layers, and the second substrate unit in that order, causing the first slot and the second slot to communicate with each other to form a cavity, and the first shielding area and the second shielding area to be disposed on two sides of the cavity, thereby obtaining an intermediate body;
pressing the intermediate body, causing the cavity having the first shielding area and the second shielding area to form the waveguide, thereby obtaining the circuit board structure.

2. The method of claim 1, wherein the second conductive layer further comprises two second artificial magnetic conductor areas disposed on two sides of the second shielding area.

3. The method of claim 1, wherein an electroplating layer is disposed on sidewalls of the cavity.

4. The method of claim 1, wherein along an extension direction of the first substrate unit or the second substrate unit, each of the first artificial magnetic conductor areas comprises a plurality of rows of artificial magnetic conductor.

5. The method of claim 1, wherein the third substrate unit comprises a third dielectric layer and two third conductive layers disposed on two opposite surfaces of the third dielectric layer, the first slot penetrates the third dielectric layer and the third conductive layers.

6. The method of claim 5, wherein each of the third conductive layer is a circuit layer.

7. The method of claim 1, wherein the first substrate unit further comprises a first circuit layer, and the first dielectric layer is disposed between the first conductive layer and the first circuit layer.

8. A method for manufacturing a circuit board structure with a waveguide, the method comprising:
providing a first substrate unit, a second substrate unit, and an adhesive layer, the first substrate unit comprising a first dielectric layer and a first conductive layer disposed on the first dielectric layer, the first conductive layer comprising a first shielding area and two first artificial magnetic conductor areas disposed on two sides of the first shielding area; the second substrate unit comprising a second dielectric layer and a second conductive layer disposed on the second dielectric layer; a surface of the second dielectric layer away from the second conductive layer being recessed inwardly to define a first slot, the second conductive layer at least disposed at a bottom surface and sidewalls of the first slot, the second conductive layer on the bottom surface and the sidewalls forming a second shielding area which is hollow, and the adhesive layer defining a second slot;
stacking the first substrate unit, the adhesive layer, and the second substrate unit in that order, causing the first slot and the second slot to communicate with each other to form a cavity, and the first shielding area and the second shielding areas to be disposed on two sides of the cavity, thereby obtaining an intermediate body;
pressing the intermediate body, causing the cavity having the first shielding area and the second shielding area to form the waveguide, thereby obtaining the circuit board structure.

9. The method of claim 8, wherein the second substrate unit further comprises a third dielectric layer and a third conductive layer, and the first slot penetrates the third dielectric layer and the third conductive layer.

10. The method of claim 8, wherein the second conductive layer is also disposed on sidewalls of the first slot, the second conductive layer on the sidewalls forms a third shielding area, and the waveguide comprises the third shielding area.

11. The method of claim 8, wherein the second dielectric layer is formed by injection molding.

12. The method of claim 9, wherein the third conductive layer is a circuit layer.

13. A circuit board structure with a waveguide, the circuit board structure further comprising:
a circuit board, the waveguide disposed in the circuit board, the circuit board comprising a first substrate unit, one adhesive layer, a third substrate unit, another adhesive layer, and a second substrate unit stacked in that order;
wherein the first substrate unit comprises a first dielectric layer and a first conductive layer disposed on the first dielectric layer, the first conductive layer comprises a first shielding area and two first artificial magnetic conductor areas disposed at two sides of the first shielding area; the second substrate unit comprises a second dielectric layer and a second conductive layer disposed on the second dielectric layer, the second conductive layer comprises a second shielding area; the third substrate unit defines a first slot, and the adhesive layer defines a second slot;

wherein the first slot and the second slot communicate with each other to form a cavity, the first shielding area and the second shielding area are disposed on two sides of the cavity, and the cavity having the first shielding area and the second shielding area forms the waveguide.

14. The circuit board structure of claim 13, wherein the second conductive layer further comprises two second artificial magnetic conductor areas disposed on two sides of the second shielding area.

15. The circuit board structure of claim 13, wherein an electroplating layer is disposed on sidewalls of the cavity.

16. The circuit board structure of claim 13, wherein along an extension direction of the first substrate unit or the second substrate unit, each of the first artificial magnetic conductor areas comprises a plurality of rows of artificial magnetic conductor.

17. The circuit board structure of claim 13, wherein the third substrate unit comprises a third dielectric layer and two third conductive layers disposed on two opposite surfaces of the third dielectric layer, the first slot penetrates the third dielectric layer and the third conductive layers.

18. The circuit board structure of claim 17, wherein each of the third conductive layer is a circuit layer.

19. The circuit board structure of claim 13, wherein the first substrate unit further comprises a first circuit layer, and the first dielectric layer is disposed between the first conductive layer and the first circuit layer.

* * * * *